United States Patent
Blattner

(10) Patent No.: US 7,287,951 B2
(45) Date of Patent: Oct. 30, 2007

(54) DEVICE AND METHOD FOR THE HARMONIZED POSITIONING OF WAFER DISKS

(75) Inventor: Jakob Blattner, Ermatingen (CH)

(73) Assignee: Tec-Sem AG (CH)

( * ) Notice: Subject to any disclaimer, the term of this patent is extended or adjusted under 35 U.S.C. 154(b) by 0 days.

(21) Appl. No.: 10/483,548

(22) PCT Filed: Jul. 9, 2002

(86) PCT No.: PCT/CH02/00375

§ 371 (c)(1),
(2), (4) Date: Jun. 17, 2004

(87) PCT Pub. No.: WO03/009340

PCT Pub. Date: Jan. 30, 2003

(65) Prior Publication Data

US 2004/0247424 A1  Dec. 9, 2004

(30) Foreign Application Priority Data

Jul. 12, 2001 (CH) ................................. 1283/01

(51) Int. Cl.
*H01L 21/673* (2006.01)

(52) U.S. Cl. .................. 414/757; 414/433; 414/754; 414/816; 414/936; 198/394; 901/30

(58) Field of Classification Search .............. 198/394; 414/433, 757, 816, 936, 754; 901/30; 318/685
See application file for complete search history.

(56) References Cited

U.S. PATENT DOCUMENTS

| | | | | |
|---|---|---|---|---|
| 4,662,811 A | * | 5/1987 | Hayden | 414/433 |
| 4,813,840 A | * | 3/1989 | Prabhakar et al. | 414/433 |
| 5,028,200 A | * | 7/1991 | Shimane | 414/757 |
| 5,125,240 A | * | 6/1992 | Knippscheer et al. | 62/266 |
| 5,183,378 A | * | 2/1993 | Asano et al. | 414/757 |
| 5,383,759 A | * | 1/1995 | Lin | 414/757 |

(Continued)

FOREIGN PATENT DOCUMENTS

EP     0 376 160     7/1990

*Primary Examiner*—Patrick Mackey
*Assistant Examiner*—M. S Lowe
(74) *Attorney, Agent, or Firm*—McGlew and Tuttle, PC

(57) ABSTRACT

A device for aligning a plurality of vertically arranged (upright) disks (20), especially wafer disks during the fabrication of semiconductor chips. Two mounting or bearing elements (30, 32) respectively have individually mounted guide rollers (34) positioned next to each other for each disk position. A drive device (40, 42; 50, 60; 240, 242) is for rotating the disks in relation to their azimuthal positions. A device (80) is provided for detecting the azimuthal positions of notches or indentations (22) arranged in the outer circumference in the disks (20). A device is provided for controlling the drive with the signals of the detection device (80) for detecting the azimuthal positions of the notches (22). The drive for rotating the disks in relation to their azimuthal positions has an individually driven drive roller element (42) for each disk (20) mounted on the stationary axis. In one embodiment, the drive roller elements, via a plurality of transmission rollers, can be selectively coupled to a driven roller (60) with the aid of the actuator elements. In a second embodiment, the first drive roller is individually driven by a plurality of individually controlled drive elements (240).

14 Claims, 4 Drawing Sheets

U.S. PATENT DOCUMENTS

| | | |
|---|---|---|
| 5,533,243 A | 7/1996 | Asano |
| 5,551,829 A * | 9/1996 | Jerolimov et al. .......... 414/757 |
| 5,662,452 A | 9/1997 | Allison |
| 5,853,284 A | 12/1998 | Ohzeki et al. |
| 5,970,818 A | 10/1999 | Kikuchi et al. |
| 6,052,913 A | 4/2000 | Kaneko et al. |
| 6,222,339 B1 * | 4/2001 | Yamasaki et al. ........... 318/685 |
| 6,554,560 B2 * | 4/2003 | Sinha ......................... 414/757 |

* cited by examiner

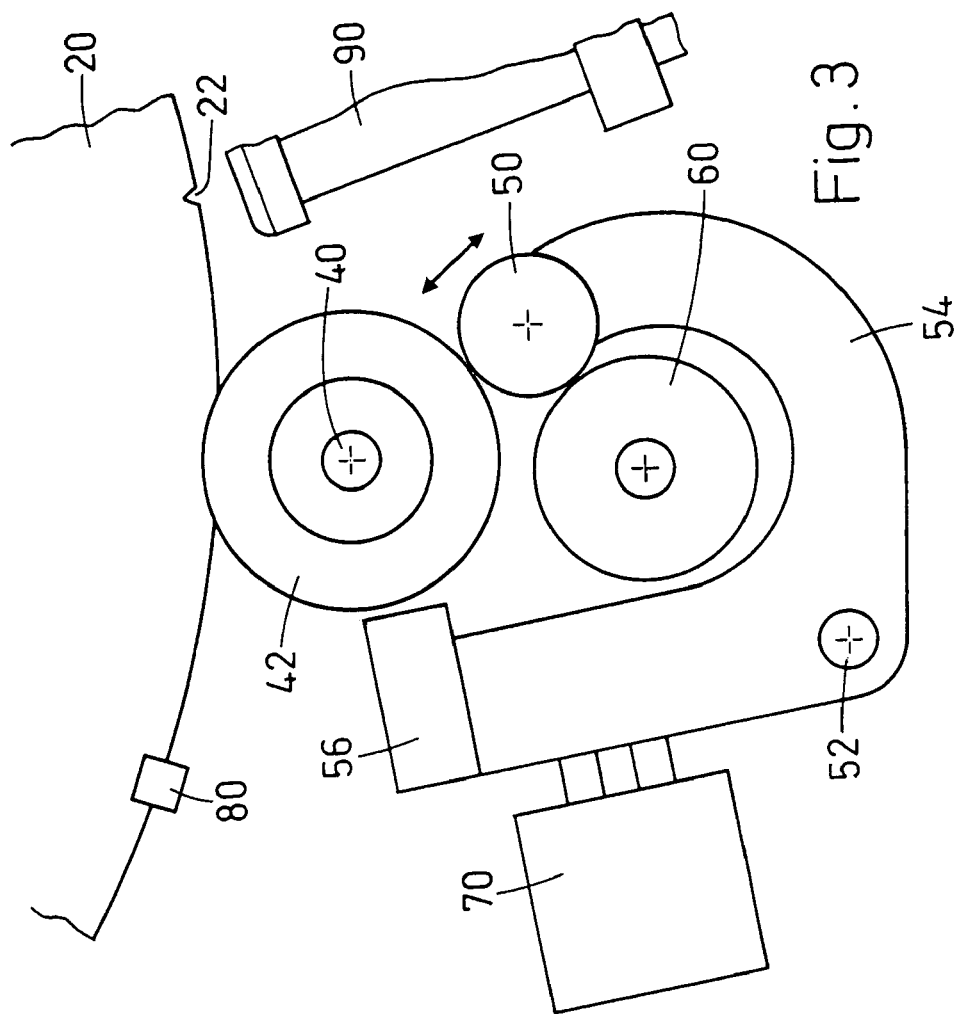
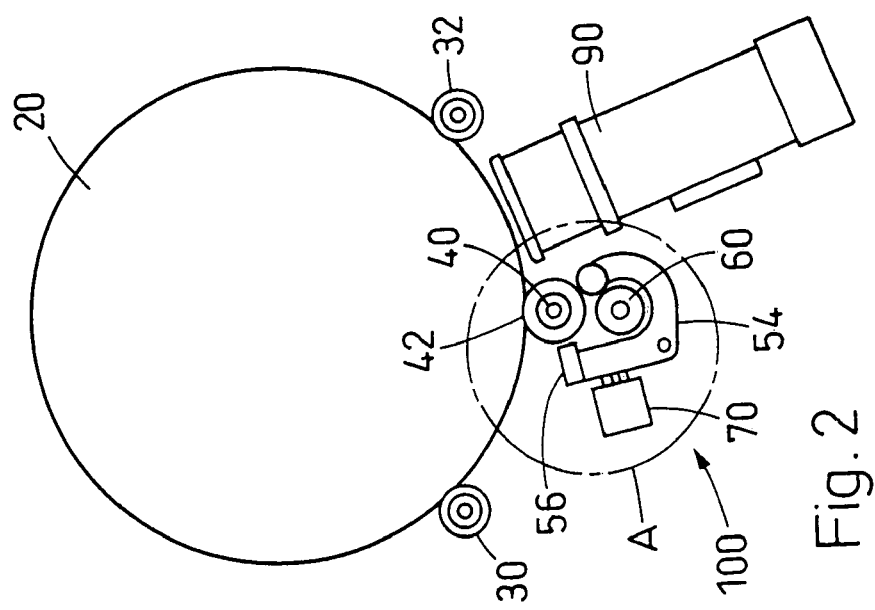

DEVICE AND METHOD FOR THE HARMONIZED POSITIONING OF WAFER DISKS

FIELD OF THE INVENTION

The present invention pertains to a device for the harmonized positioning of a plurality of wafer disks as well as to a process therefor. The present invention pertains, in particular, to a device with which a plurality of vertically positioned, approximately circular wafer disks are aligned in a harmonized manner in relation to a notch formed in the outer circumference.

BACKGROUND OF THE INVENTION

At a certain stage of their processing, the wafer disks introduced into the fabrication process are cut into approximately circular disks. For various reasons, which include the crystalline orientation in the plane of the disk, on the one hand, and the arrangement of markings applied, e.g., in the outer area of the wafer disks, on the other hand, it is necessary to position a batch of wafer disks in a harmonized manner in relation to their azimuthal alignment. This is carried out when the wafer disks are arranged on a device standing next to each other. Even though a device and a process in which the wafer disks are positioned lying azimuthally one on top of another, e.g., in the reaction chamber, are also known from U.S. Pat. No. 6,052,913, this has essential drawbacks, which are due to the fact that very fine particles present in the air or gas flowing through will not settle on the wafer disks, on the one hand, and an azimuthal positioning is to be preferred in the case of the vertical arrangement of the wafer disks in respect to the processing operations to be performed before and thereafter, on the other hand.

For the harmonized positioning, the wafer disks are provided with a notch in the outer circumference. This notch may be either in the form of an approximately triangular incision or in the form of a circular segment-shaped incision.

U.S. Pat. No. 5,533,243 discloses a device and a corresponding process in which vertically arranged wafer disks are arranged on a drive roller and another roller, over which a plurality of small free-running wheels are pulled. The azimuthal harmonization of the individual notches is performed corresponding to the suggestion according to U.S. Pat. No. 5,533,243 such that the circular segment-shaped notches prevent the movement of the wafer disks by the drive roller when the notches arrive at the drive roller. The wafer disks are then rotated together into the desired position with another driven roller (notch moving roller). However, this process has numerous drawbacks. On the one hand, wafer disks with circular segment-shaped incisions are necessary for the device, which is not always the case in practice. On the other hand, the process is, however, liable to fault due to the plurality of driven rollers and the change in the height position of the wafer disks during the different phases of alignment and it is not beneficial to the wafer disk due to the generation of particles by the drive rollers.

U.S. Pat. No. 5,662,452 discloses a device in which an aligning bar is rotated by a drive roller and the wafer disks arranged in the vertical position are now rotated until the likewise circular segment-shaped notches snap into the aligning bar, which is smaller than they are, so that no further rotation is possible. This device also has technical drawbacks, because, on the one hand, only wafer disks with circular segment-shaped notches can again be positioned and, on the other hand, the device is designed such that the aligning bars will rotate further in the notches and generate friction, which produce abraded particles, until the operation is terminated and all wafer disks are aligned. Furthermore, this device likewise has the drawback that the height of the wafer disks will change during the aligning operation due to snapping in. Furthermore, the drawback that a slow phase, which should be avoided, must be provided to ensure the reliability of the snapping in is essential.

A process similar to the above-mentioned two processes is also known in U.S. Pat. No. 5,853,284, in which the force transmission is stopped by a slight change in height during the snapping in of the driven roller into the—necessarily circular segment-shaped—notches by the force transmission to the roller being designed as a slip clutch. Besides the above-mentioned drawbacks in terms of a change in height, this also leads to abraded particles, which shall be avoided according to the present invention.

U.S. Pat. No. 5,970,818 discloses a device that is already capable, in principle, of positioning wafer disks with triangular notches, but without overcoming the drawbacks of the above-mentioned state of the art, because the lowering of the wafer disks is likewise made use of, but the wafer disks will then drop so low that a braking means provided especially for this purpose prevents the further rotation of the wafer disks, doing so, however, again at the expense of slipping of the drive roller on the wafer disk.

It is already known from the above-mentioned U.S. Pat. No. 5,533,243 that the position of the notches is checked with an optical sensor, but the sensor is used there only to determine whether or not the notches of all wafer disks are in the same position, namely, in one row, through which the optical beam can pass.

SUMMARY OF THE INVENTION

Consequently, the object of the present invention is to develop a device for aligning vertically standing wafer disks and to propose a process, in which device and process the above-described drawbacks of the devices and processes according to the state of the art are avoided and, in particular, the height position of the wafer disks is not changed during the alignment, abraded particles at the wafer disks or in their vicinity are avoided, and with which wafer disks with notches of different shapes can also be aligned. Furthermore, the device shall be simple and not have unnecessary and disturbing brakes, which may damage the wafer disks or whose abraded particles may precipitate on the wafer disks. Furthermore, one object of the present invention is to avoid the slow phase during the snapping in and thus to make possible a faster operation.

According to the invention, a device is provided for aligning a plurality of vertically arranged disks, especially wafer disks during the fabrication of semiconductor chips. The device includes a first mounting element and a second mounting element arranged at a spaced location from the first mounting element. The mounting elements have individually mounted guide rollers positioned next to each other for each disk position. The guide rollers have in turn a means for receiving the disks. A drive means is provided for rotating the disks in relation to their azimuthal positions. A detecting means is provided for detecting the azimuthal positions of the notches arranged in the outer circumference in the disks. A control means for controlling the drive means with the signals of the detecting means is provided. The drive means rotates the disks in relation to their azimuthal positions and has an individually driven drive roller element for each disk. The drive roller element is pulled over a stationary axle.

The consequence of the measures according to the present invention is at first that abraded particles generated by a slip clutch or a braking action on the wafer disks, which could precipitate on the wafer disks, are not generated during the rotation of the wafer disks for the purpose of alignment. Furthermore, the consequence of the measures according to the present invention is that all the wafer disks assume the same height position, which will not change, during the alignment operation. The mechanical snapping in described in the state of the art can consequently be completely avoided. A certain form of the positioning notches is not necessary, and their size is not specified, either.

Especially advantageous is a process in which fast alignment of the wafer disks is performed in a first direction of rotation, and a fine alignment is performed in the opposite direction of rotation, because coordination of the first, higher speed of rotation and of the accuracy of notch detection is not necessary in this case, but this can be shifted to the fine coordination.

The above-mentioned elements according to the present invention as well as the claimed elements according to the present invention, which are described in the following exemplary embodiments, are not subject to any special exceptional conditions concerning their size, shape, the material used for them and the technical concept, so that the selection criteria known in the particular field of application can be used without restrictions.

Furthermore, the device is not limited to the positioning of wafer disks. Both the device and the process can be used for other disks, e.g., CDs, etc.

Further details, features and advantages of the subject of the present invention will appear from the following description of the corresponding drawings, in which a device and a corresponding procedure will be explained as examples for the present invention. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

FIG. 2 is a schematic view of the device according to FIG. 1;

FIG. 3 is a drawing of detail A from FIG. 2;

DESCRIPTION OF THE PREFERRED EMBODIMENTS

Figure 1:
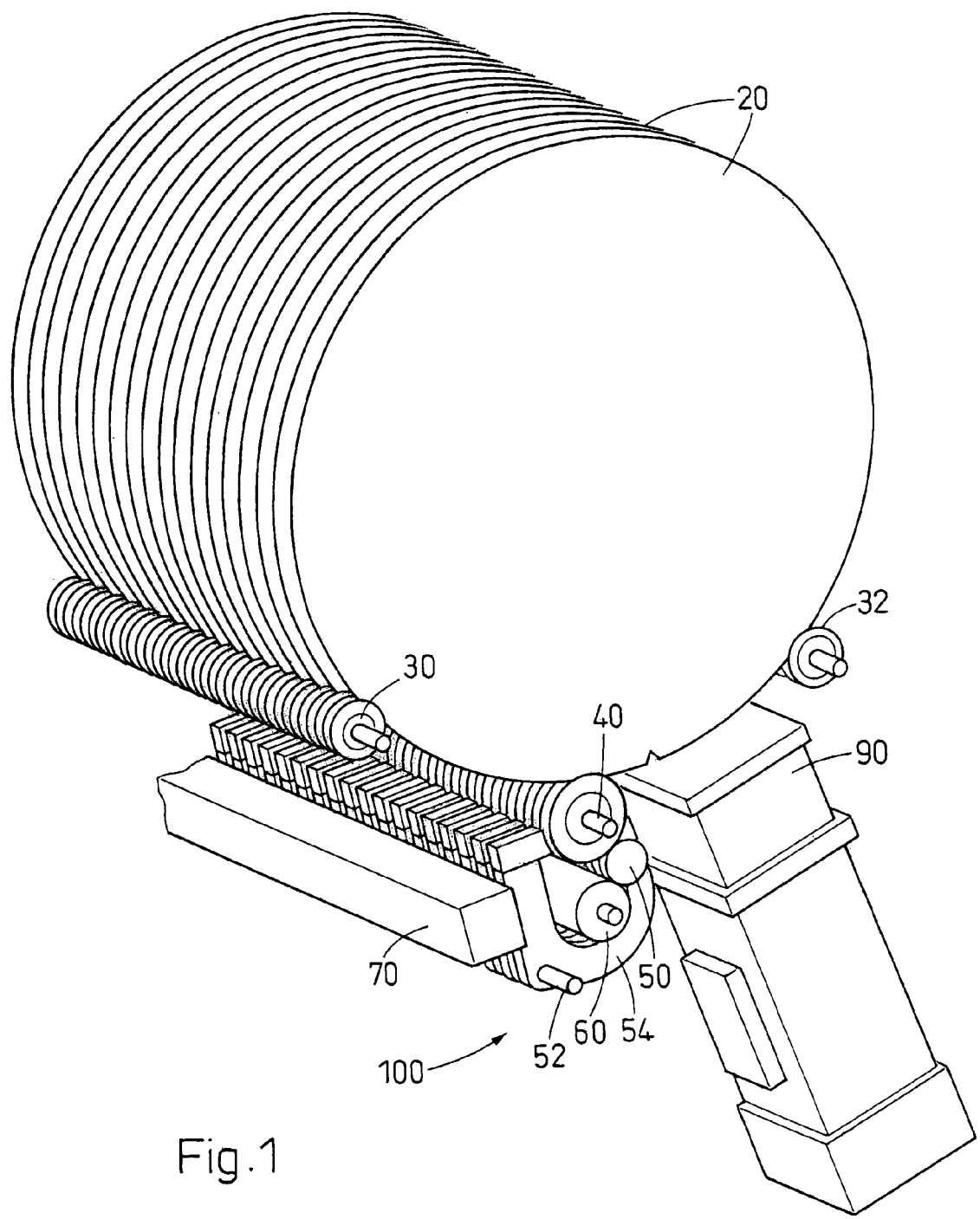
FIG. 1 is a side view of the device for positioning wafer disks according to a first exemplary embodiment of the present invention.
Figure 4:
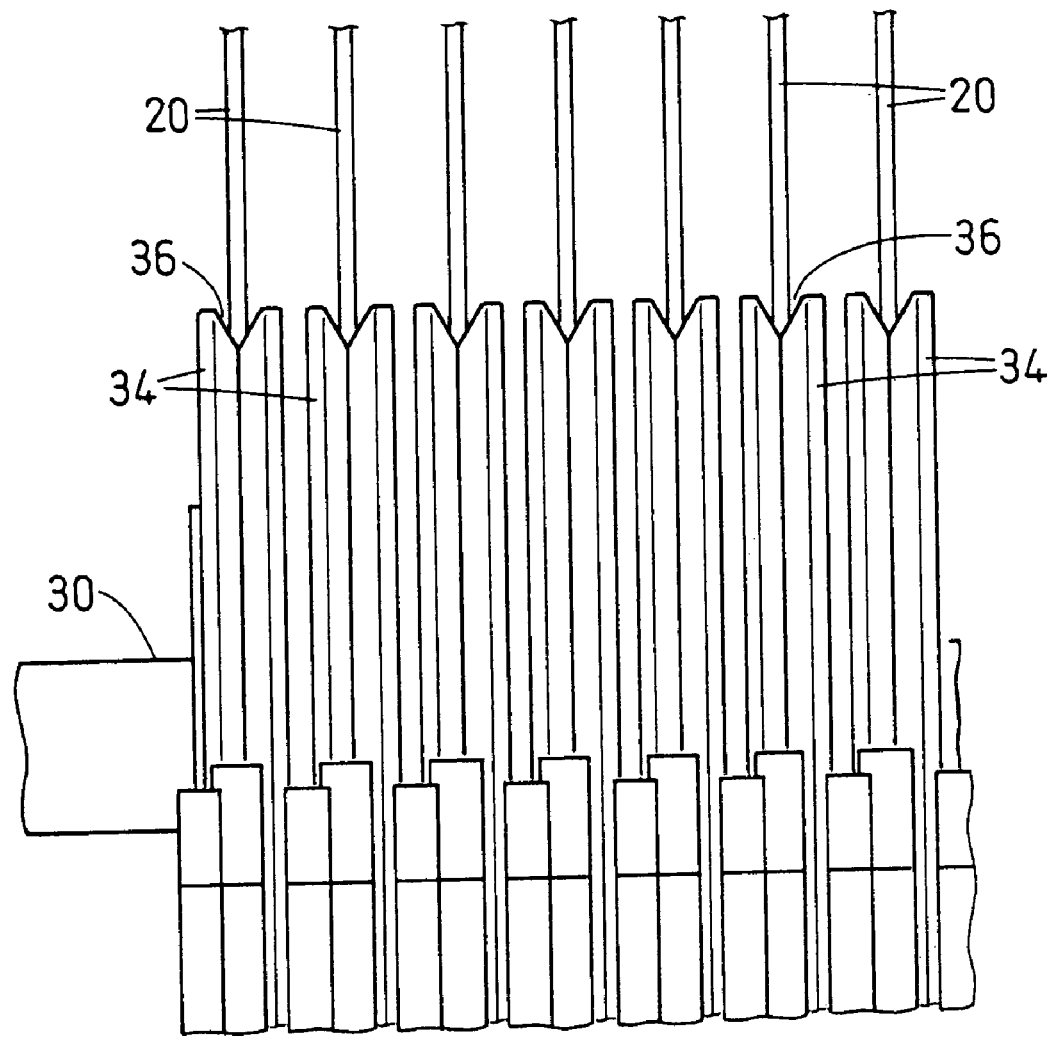
FIG. 4 is a drawing of a detail of the drive rollers and the guide rollers of the first exemplary embodiment.
Figure 6:
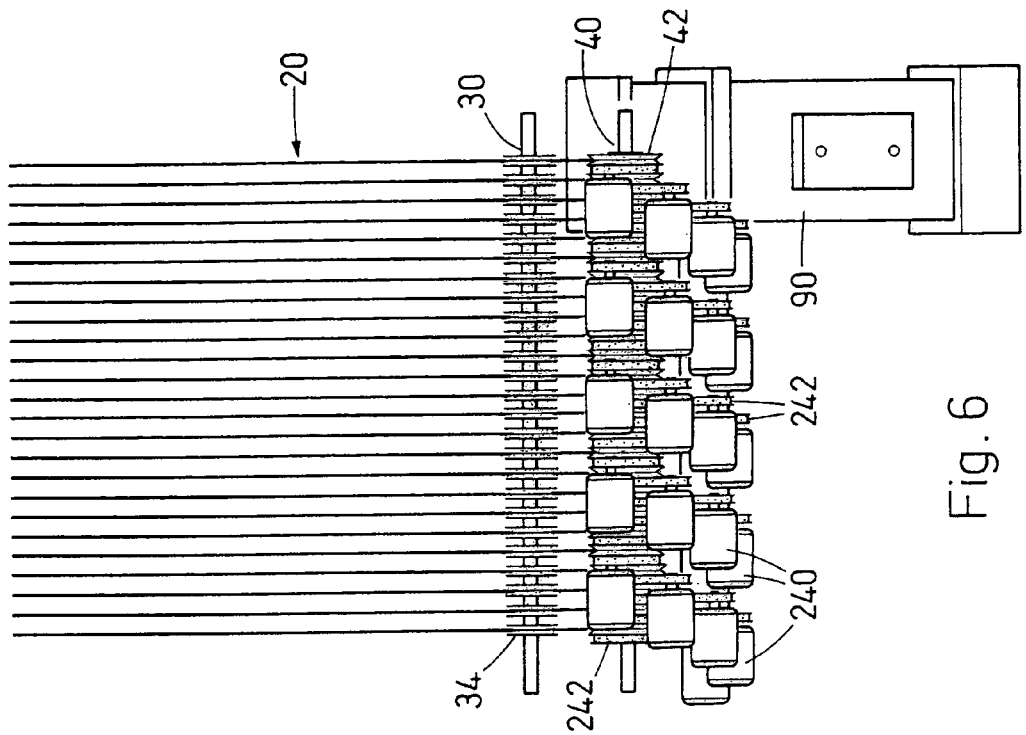
FIG. 6 is a front view of the device according to FIG. 5.
Figure 5:
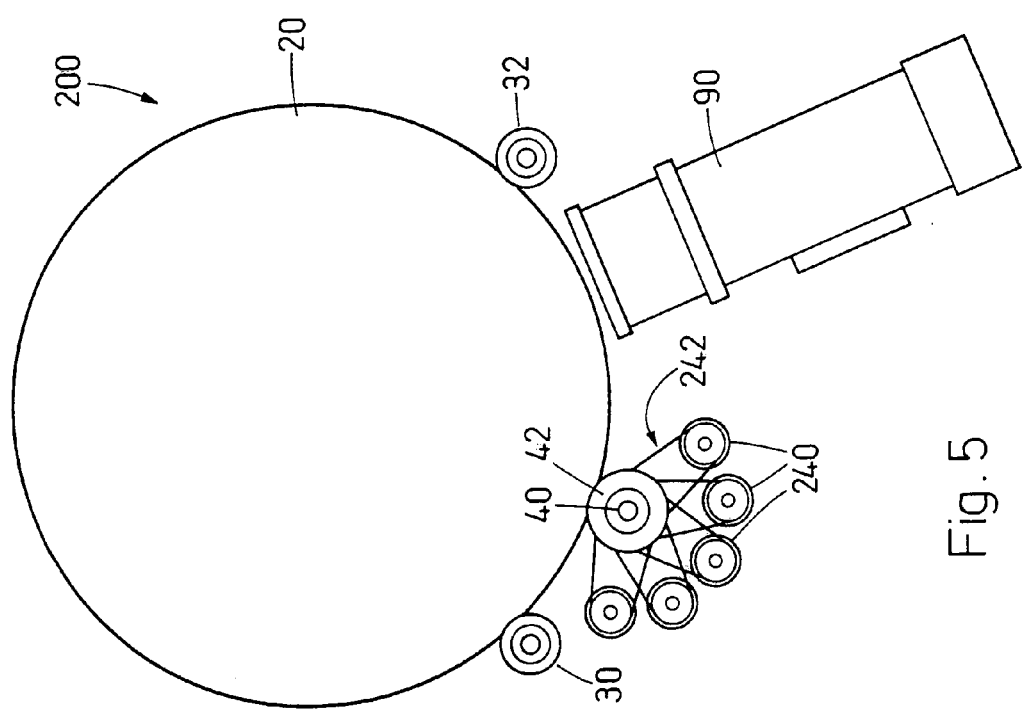
FIG. 5 is a side view of the device for positioning wafer disks according to a second exemplary embodiment of the present invention.

Referring to the drawings in particular, a device for positioning wafer disks is designated as a whole by 100 in FIG. 1, the wafer disks 20 are arranged on the guide rollers 34 of a first and a second mounting roller 30 and 32 such that they are held vertically in the guide rollers 34 by V notches 36. The guide rollers are mounted individually, so that a movement of a wafer disk does not induce any movement of another wafer disk.

In the first exemplary embodiment, the wafer disks are driven by the individually mounted drive roller elements 42, which are pulled over a stationary, i.e., non-rotating axle 40, always with a V notch. The drive roller elements 42 are driven selectively in the first exemplary embodiment by the rotary movement of a second drive roller 60, which is driven with an electric motor, being transmitted to the drive roller element 42 by means of a transmission roller 50. A transmission roller 50 each, one of which brings about the selective coupling, is provided for each drive roller element 42. Each transmission roller 50 can assume two states, namely, the coupled state, on the one hand, in which it is in connection with the drive roller element 42 associated with it and with the second drive roller 60, and an uncoupled state, in which it is released from at least one of the above-mentioned elements, namely, the drive roller element 42 associated with it and the second drive roller 60. The transmission rollers 50 are not in connection with any of the elements in the uncoupled state in the exemplary embodiment.

The coupling or uncoupling is brought about in this exemplary embodiment with levers 54, which are pivoted around a fulcrum point 52 and at one end of which the transmission rollers 50 are arranged. Brake elements 56, which brake the particular drive roller element 42 in the uncoupled state of the particular transmission rollers 50, are arranged at the other ends of the levers 54. The pivoting of the levers 54 into the coupled state or into the uncoupled state is brought about by actuator elements 70, which are arranged such that each lever can be moved individually into the coupled or uncoupled state. In an embodiment of this exemplary embodiment, the actuator elements 70 are moved pneumatically and actuated by a control means. In an alternative embodiment, the actuator elements 70 are moved magnetically. However, all other embodiments with which the intended action can be triggered may be provided for the actuator elements 70.

A sensor unit 80, which triggers a signal as soon as the aligning notch 22 of the wafer disk is recognized at a certain azimuthal position, is provided for each wafer disk in this exemplary embodiment. Sensors with photocells and tilted mirrors are used, as they are disclosed, e.g., in DE 197,248 A1. A control unit signals in this case that the corresponding actuator element uncouples the associated transmission roller 50 and brakes the drive roller element 42. Once this operation has been performed for all wafer disks 20 that are to be positioned, the direction of rotation of the drive roller is reversed, and fine alignment is performed in the opposite direction with a lower speed of rotation. It is possible now to set the device such that the individual water notches 22 are rotated out of the detection range of the sensor means 80 during braking and are then again rotated back into the detection range by the fine alignment with a low speed and are definitively braked during the repeated triggering of the sensor signals (binary detection). However, it is also possible to make the detection range of the sensor units 80 so large that the notches 22 do not leave the detection range during braking and the fine alignment is performed within the detection range, in which case the detection signal contains an azimuthal position of the notch in the detection range. The position signal may be a digital signal or an analog signal in this case.

In a second exemplary embodiment, the device for positioning wafer disks 20 is designated as a whole by 200. The wafer disks 20 are again arranged vertically on two mounting rollers 30 and 32 with individually mounted guide rollers 34.

As in the first exemplary embodiment, the wafer disks 20 are again driven by the drive roller elements 42. However, the drive roller elements 42 are driven selectively in the second exemplary embodiment by a separate drive motor 240, which is connected to the drive element with a belt 242 or with a transmission element having a similar action, being associated with each drive roller element 42. Each drive motor is actuated individually by a control means. As in the first exemplary embodiment, the control means is connected to a sensor unit, which detects the azimuthal positions of the notches 22 in the wafer disks 20.

The procedure described in connection with the first exemplary embodiment with the rotation of the wafer disks at a first, higher speed of rotation, the braking and a fine alignment in the opposite direction of rotation at a lower speed of rotation is likewise meaningful in the second exemplary embodiment, because it is now likewise unnecessary to coordinate the first, higher speed of rotation and the accuracy of detection, but this coordination can be shifted to the fine alignment. The function of the brake is assumed by the particular electric motor in this case.

Subsequent to the azimuthal positioning of the wafer disks 20, a water identification process is carried out in this exemplary embodiment, in which an identification mark located in the outer area of the disks 20 is read with a camera 90. Since this identification mark is arranged at a fixed angle in relation to the notches on the wafers, the azimuthal alignment of the wafer disks in relation to the notches is necessary to perform the reading of the identification mark and the identification of the wafers with the camera.

While specific embodiments of the invention have been shown and described in detail to illustrate the application of the principles of the invention, it will be understood that the invention may be embodied otherwise without departing from such principles.

The invention claimed is:

1. A device for aligning a plurality of vertically arranged disks during the fabrication of semiconductor chips, the device comprising:
   a first mounting element;
   a second mounting element arranged at a spaced location from the first mounting element, wherein the mounting elements have individually mounted guide rollers positioned next to each other for each of the disks, said guide rollers including means for receiving the disks;
   a drive means for rotating azimuthal positions of the disks;
   a detecting means for detecting the azimuthal positions of notches arranged in the outer circumference in the disks; and
   a control means for controlling the drive means with the signals of the detecting means for detecting the azimuthal positions of the notches, said drive means for rotating the azimuthal positions of the disks having an individually driven drive roller element for each disk, said drive roller element being mounted on a stationary axle, said drive means including a plurality of electric motors, and a plurality of transmission elements, each of said transmission elements transmitting a driving movement from one of said electric motors to one of said drive roller elements, each of said motors being dedicated to a separate one of said drive roller elements, said control means individually controlling a driving motion of each said guide roller of said mounting elements by the signals from said detecting means.

2. An aligning device in accordance with claim 1, wherein the detecting means for detecting the azimuthal positions of notches arranged in the outer circumference in the disks comprises a plurality of optical sensors.

3. An aligning device in accordance with claim 1, wherein the transmission elements have belts, with which the electric motors drive the drive roller elements.

4. A device in accordance with claim 1, wherein:
   said guide rollers of each of said mounting elements rotate independently of one another.

5. A device in accordance with claim 1, wherein:
   said control means individually controls each of said electric motors to rotate in a first direction until a respective disk is in a predetermined position, and then individually controls said each electric motor to rotate in a second direction opposite to said first direction.

6. A device in accordance with claim 1, wherein:
   each of said transmission elements transmits a driving movement from a separate one of said electric motors to a separate one of said drive roller elements.

7. A device for aligning a plurality of disks, each of the disks defining a notch, the device comprising:
   first and second mounting elements arranged spaced from each other, each of said mounting elements having a plurality of guide rollers, said mounting elements and said guide rollers being arranged to support the disks;
   a plurality of sensors arranged around the disks which are supported on said mounting elements, said plurality of sensors individually detecting a position of the notches of each of the disks and generating a position signal indicating the position of the notches of each of the disks;
   a drive unit arranged to individually and independently rotate the plurality of disks supported on said mounting elements, said drive unit including a plurality of electric motors, each one of said electric motors generates rotary motion which individually and independently rotates one of the plurality of disks;
   a control unit receiving said position signal from said plurality of sensors, said control unit controlling each one of said electric motors to individually and independently position a respective one of the plurality of disks on said mounting elements according to said position signal.

8. A device in accordance with claim 7, wherein:
   said plurality of guide rollers on each of said first and second mounting elements rollers are independently rotatable.

9. A device in accordance with claim 7, wherein:
   said control unit individually controls each of said electric motors to rotate in a first direction until a respective disk is in a predetermined position, and then individually controls said each electric motor to rotate in a second direction opposite to said first direction.

10. A device in accordance with claim 9, wherein:
    said control unit rotates said electric motors faster in said first direction for a coarse alignment of the disks, and said control unit rotates said electric motors slower in said second direction for a fine alignment of the disks.

11. A device for aligning a plurality of vertically arranged disks during the fabrication of semiconductor chips, the device comprising:
    a first mounting element;

a second mounting element arranged at a spaced location from the first mounting element, wherein the mounting elements have individually mounted guide rollers positioned next to each other for each of the disks, said guide rollers including means for receiving the disks;

a drive means for rotating azimuthal positions of the disks;

a detecting means for detecting the azimuthal positions of notches arranged in the outer circumference in the disks; and a control means for controlling the drive means with the signals of the detecting means for detecting the azimuthal positions of the notches, said drive means for rotating the azimuthal positions of the disks having an individually driven drive roller element for each disk, said drive roller element being mounted on a stationary axle, said drive means including a plurality of electric motors, and a plurality of transmission elements, each of said transmission elements transmitting a driving movement from one of said electric motors to one of said drive roller elements, said control means individually controlling a driving motion of each said guide roller of said mounting elements by the signals from said detecting means.

12. A device for aligning a plurality of vertically arranged disks during the fabrication of semiconductor chips, the device comprising:

a first mounting element;

a second mounting element arranged at a spaced location from the first mounting element, wherein the mounting elements have individually mounted guide rollers positioned next to each other for each of the disks, said guide rollers including means for receiving the disks;

a drive means for rotating azimuthal positions of the disks;

a detecting means for detecting the azimuthal positions of notches arranged in the outer circumference in the disks; and a control means for controlling the drive means with the signals of the detecting means for detecting the azimuthal positions of the notches, said drive means for rotating the azimuthal positions of the disks having an individually driven drive roller element for each disk, said drive roller element being mounted on a stationary axle, said drive means including a plurality of electric motors, and a plurality of transmission elements, each of said transmission elements transmitting a driving movement from one of said electric motors to one of said drive roller elements, said control means individually controlling each of said electric motors to rotate in a first direction until a respective disk is in a predetermined position, and then individually controlling said each electric motor to rotate in a second direction opposite to said first direction.

13. A device in accordance with claim 12, wherein:

said control means rotates said electric motors faster in said first direction for a coarse alignment of the disks, and said control means rotates said electric motors slower in said second direction for a fine alignment of the disks.

14. A device for aligning a plurality of vertically arranged disks during the fabrication of semiconductor chips, the device comprising:

a first mounting element;

a second mounting element arranged at a spaced location from the first mounting element, wherein the mounting elements have individually mounted guide rollers positioned next to each other for each of the disks, said guide rollers including means for receiving the disks;

a drive means for rotating azimuthal positions of the disks;

a detecting means for detecting the azimuthal positions of notches arranged in the outer circumference in the disks; and a control means for controlling the drive means with the signals of the detecting means for detecting the azimuthal positions of the notches, said drive means for rotating the azimuthal positions of the disks having an individually driven drive roller element for each disk, said drive roller element being mounted on a stationary axle, said drive means including a plurality of electric motors, and a plurality of transmission elements, each of said transmission elements transmitting a driving movement from one of said electric motors to one of said drive roller elements, each of said motors being dedicated to a separate one of said drive roller elements, said control means individually controlling each of said electric motors to rotate in a first direction until a respective disk is in a predetermined position, and then individually controls said each electric motor to rotate in a second direction opposite to said first direction.

* * * * *